(12) United States Patent
Vogler et al.

(10) Patent No.: US 6,639,179 B2
(45) Date of Patent: Oct. 28, 2003

(54) APPARATUS FOR PRODUCING MICROBORE HOLES

(75) Inventors: Sven Vogler, Heidelberg (DE); Roland Kaplan, Heidelberg (DE)

(73) Assignee: Heidelberg Instruments Mikrotechnik GmbH, Heidelberg (DE)

( * ) Notice: Subject to any disclaimer, the term of this patent is extended or adjusted under 35 U.S.C. 154(b) by 0 days.

(21) Appl. No.: 10/052,912

(22) Filed: Jan. 23, 2002

(65) Prior Publication Data

US 2002/0121507 A1 Sep. 5, 2002

Related U.S. Application Data

(63) Continuation of application No. PCT/EP00/06914, filed on Jul. 19, 2000.

(30) Foreign Application Priority Data

Jul. 23, 1999 (DE) .......................................... 199 33 872

(51) Int. Cl.[7] .............................................. B23K 26/38
(52) U.S. Cl. ................................................ 219/121.71
(58) Field of Search ........................ 219/121.71, 121.7, 219/121.67, 121.68, 121.69, 121.63, 121.64, 121.65, 121.66, 121.73, 121.75, 121.8, 121.78; 700/186, 166

(56) References Cited

U.S. PATENT DOCUMENTS

| | | | |
|---|---|---|---|
| 5,124,522 A | * | 6/1992 | Booke et al. .......... 219/121.19 |
| 5,690,846 A | | 11/1997 | Okada et al. |
| 5,751,588 A | | 5/1998 | Freedenberg et al. |
| 5,841,102 A | * | 11/1998 | Noddin .................. 219/121.71 |
| 6,143,401 A | * | 11/2000 | Fischer et al. ........... 428/322.7 |
| 6,171,964 B1 | * | 1/2001 | Gonzalez et al. ........... 438/694 |
| 6,407,363 B2 | * | 6/2002 | Dunsky et al. ........ 219/121.71 |
| 6,430,465 B2 | * | 8/2002 | Cutler ........................ 700/193 |
| 6,433,301 B1 | * | 8/2002 | Dunsky et al. ........ 219/121.67 |

FOREIGN PATENT DOCUMENTS

EP 0884128 12/1998

* cited by examiner

Primary Examiner—Tom Dunn
Assistant Examiner—Jonathan Johnson
(74) Attorney, Agent, or Firm—Crowell & Moring LLP

(57) ABSTRACT

A method of producing microbore holes in a multi-layer substrate (5), preferably a printed circuit board substrate, that is displaced below writing optics (4) by an XY stage (6), using the optics to generate a spot from a light source (1), preferably a laser. The method reduces the treatment time and preferably compensates for distortions in the substrate material. To this end, the position of the spot within a working field is changed simultaneously with the treatment positions by electronically controlled, movable mirrors. The position of the substrate is determined by an interferometer (9, 11), and the signals corresponding to the substrate position are processed by a suitable computer system (16) to obtain an actual position of the table system. The computer system (16) is preferably provided with all bore hole coordinates and additional information such as bore hole diameter, especially in tabular form.

17 Claims, 10 Drawing Sheets

APPARATUS FOR PRODUCING MICROBORE HOLES

CROSS REFERENCE TO RELATED APPLICATIONS

This application is a continuation of international patent application no. PCT/EP00/06914, filed Jul. 19, 2000, designating the United States of America, the entire disclosure of which in incorporated herein by reference. Priority is claimed based on Federal Republic of Germany patent application no. DE 199 33 872.8, filed Jul. 23, 1999.

BACKGROUND OF THE INVENTION

The invention relates to a method of producing microbore holes and to an apparatus for producing microbore holes. A method and an apparatus for producing microbore holes of the aforementioned type are known from published European Patent Application No. EP 884,128. According to this document, a substrate is arranged on an XY stage or table which can be positioned along X and Y coordinates in the desired treatment positions, whereby the bore hole coordinates of the borings to be introduced and additional information such as bore hole diameter are provided by a computing system. In order to enable the production of bore holes with diameters of 50 $\mu$m or less using a conventional $CO_2$ laser, the laser beam is converted to a beam having a small wavelength, using a tellurium crystal. Changing the diameter of the beam or the spot is not described.

Furthermore, it is problematic that when the laser power is increased to produce larger bore hole diameters, instead of a cylindrical bore hole a conical expansion of the bore hole can occur as a result of focusing the laser beam.

In addition, a method and an apparatus for treating substrates are known from U.S. Pat. No. 5,690,846, in which errors resulting from distortions and/or faulty alignments of the substrate can be compensated for by using a special computer method. There is no reference therein to influencing the diameter of the spot.

SUMMARY OF THE INVENTION

An object of the present invention is to provide a new method of the aforementioned type so as to enable rapid and reliable production of bore holes having different diameters.

Another object of the invention is to provide a new apparatus of the aforementioned type with which bore holes having different diameters can be rapidly and reliably produced.

These and other objects are achieved in accordance with the present invention by providing a method of producing microbore holes in a multilayer substrate that is displaced below writing optics by an XY stage, wherein the writing optics generate a spot from a light beam source; the position of the light spot within a working field is changed simultaneously with substrate treating positions by a positioning unit comprising electronically controlled, movable mirrors; the position of the substrate is determined; signals corresponding to the substrate position are processed by a computer to obtain an actual position of the XY stage, and the diameter of the spot is changed by an expansion ratio determined by the computer, using variable beam expansion optics.

In accordance with another aspect of the invention, the objects are achieved by providing an apparatus for producing microbore holes in a multilayer substrate comprising writing optics for generating a light spot from a light beam source; an XY stage for moving the substrate to different treatment positions below the writing optics; the writing optics including a beam deflecting unit comprising electronically controlled, movable mirrors for changing the position of the light spot within a working field on the substrate simultaneously with the treatment positions; means for determining the position of the substrate, and a computer for processing signals corresponding to the substrate position to obtain an actual position of the XY stage, wherein the writing optics further comprise a variable beam expansion optics arranged in a light beam path between the light source the beam deflection unit; the variable bean expansion optics outputting a light beam having a diameter that is varied according to an expansion ratio determined by the computer.

In the method and apparatus of the invention, the light from a pulsed laser, for example UV light from a frequency-multiplied Nd:YAG laser or infrared light from a $CO_2$ laser, can be used to produce bore holes in materials used in the production of electronic printed circuit boards. The parameters of the light source and the optics used, such as the laser power, pulse duration, and size of the spot, are generally known to persons skilled in the art. Treatment systems of the current art basically comprise an XY stage that positions the substrate to be treated below an optical structure that is appropriate for the optical requirements. The optical structure performs two functions. First, it produces an intense pulsed laser spot for treating the substrate at the required position. Second, it determines the position by recognizing preset substrate marks from previous production steps. This step requires an image processing system comprising an electronic camera and a suitably equipped computer system that determines the desired positional information from the camera signals.

The overall precision of the position of the bore holes in the substrate relative to the preset marks is determined by the positional precision of the XY stage system, and the precision of spot positioning of both the optical beam forming system and the optical measuring system. In modern printed circuit boards constructed from a plurality of layers of conductors and insulation materials, material distortions occur during the individual production steps, making it necessary to adapt the bore hole patterns to the individual distortion of the base substrate. This in turn requires very high precision in the measuring and positioning of the XY stage system and the beam optics.

For economic reasons it is necessary to minimize as much as possible the overall treatment time as well as the time for each bore hole to be produced. Depending on the particular application or the technology of the printed circuit boards, bore hole diameters of a few tenths of a millimeter down to 50 $\mu$m should be maintained. Since the spot diameter of the laser beam is approximately 25 $\mu$m for typical UV laser treatment systems, bore hole diameters that deviate from this value must be created by lining up individual treatment steps, identified hereinafter as "passes." The removal of material by multiple passes along a production line, suitably chosen and generally spiral-shaped, is referred to as "nibbling." Although this method allows bore hole diameters to be produced in any size, it has the disadvantage of being very time-consuming.

Since the energy requirements per pass depend greatly on the material to be treated, an optimized treatment strategy is desirable. If sufficient energy is available for each laser pulse, the throughput is significantly increased if instead of the nibbling method a more suitable, larger spot diameter is chosen, and only one pass removes the required amount of material for the desired bore hole diameter. The basis of the novel method described here is that the spot diameter of the laser beam used for treatment may be varied within a very short time, thus producing bore images of different diameters in a single operation.

BRIEF DESCRIPTION OF THE DRAWINGS

The invention will be described in further detail hereinafter with reference to illustrative preferred embodiments shown in the accompanying drawings, in which.

DETAILED DESCRIPTION OF PREFERRED EMBODIMENTS

Figure 1:
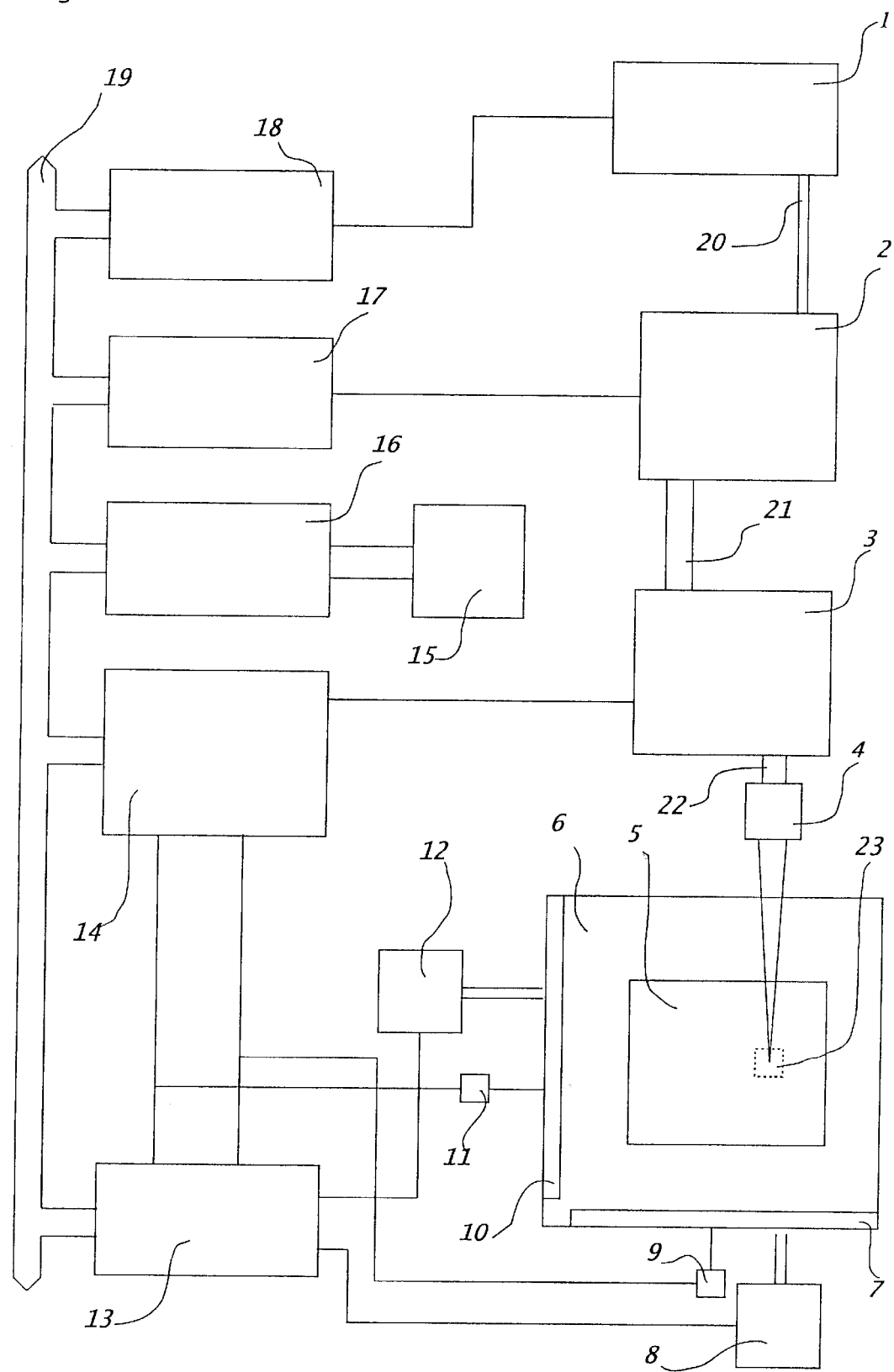
FIG. 1 is a schematic representation of an illustrative embodiment of an apparatus according to the invention.

A laser used as a light source, for example a frequency-tripled Nd:YAG laser, is designated by 1 in FIG. 1. The laser emits a brief, very powerful light pulse with a duration of approximately 10–20 ns and energy of approximately $10^{-4}$ Joule as soon as a start signal from the control computer 16 arrives at the laser electronic system 18. The light 20 emitted by the laser enters the variable beam expansion optics 2. The diameter of the output beam 21 varies in accordance with the expansion ratio, which is determined by the control unit 17 of the computer 16, as detailed in FIGS. 4, 5, and 6.

Figure 2:
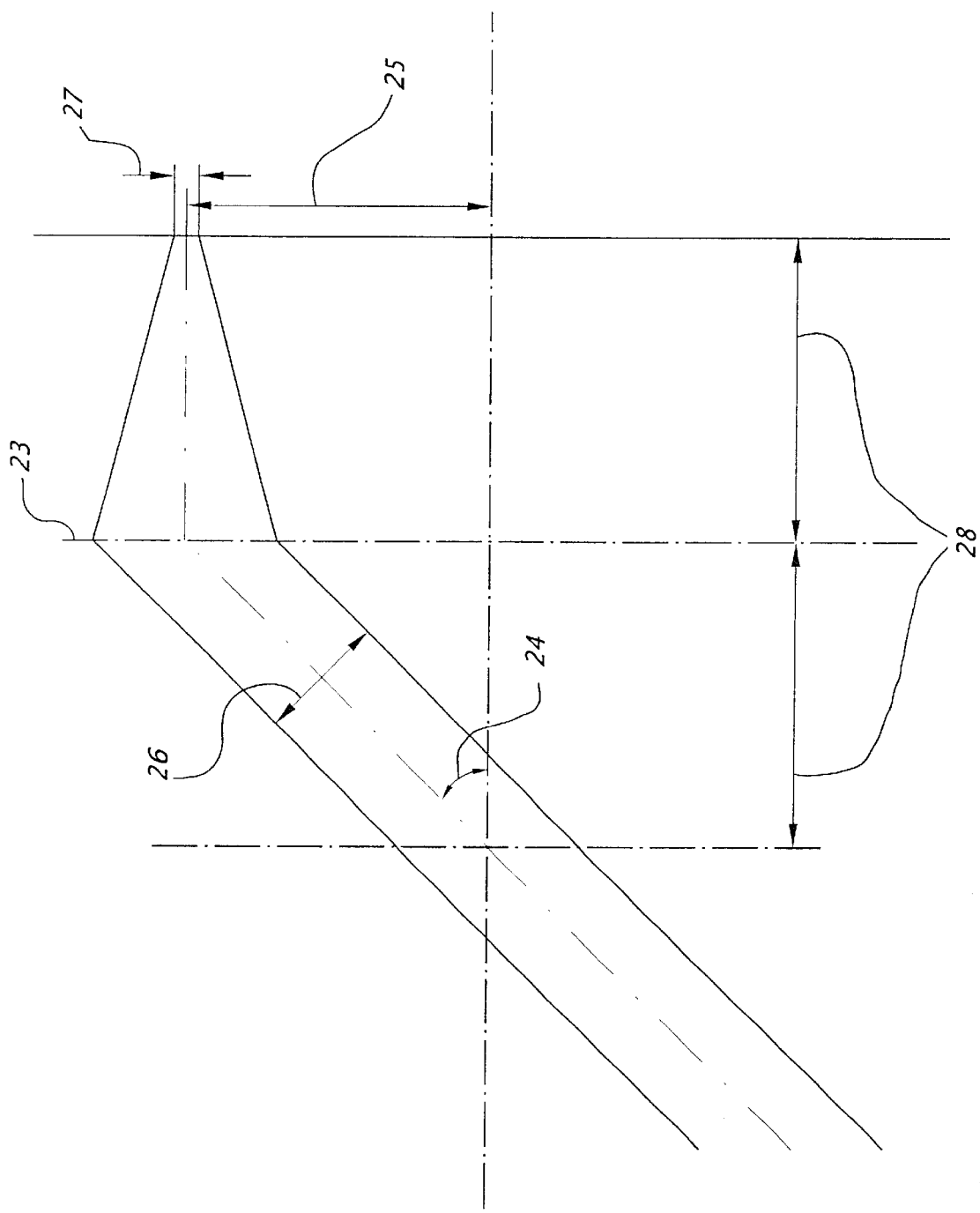
FIG. 2 is a schematic illustration of the light beam path in an apparatus for carrying out the invention.
Figure 7:
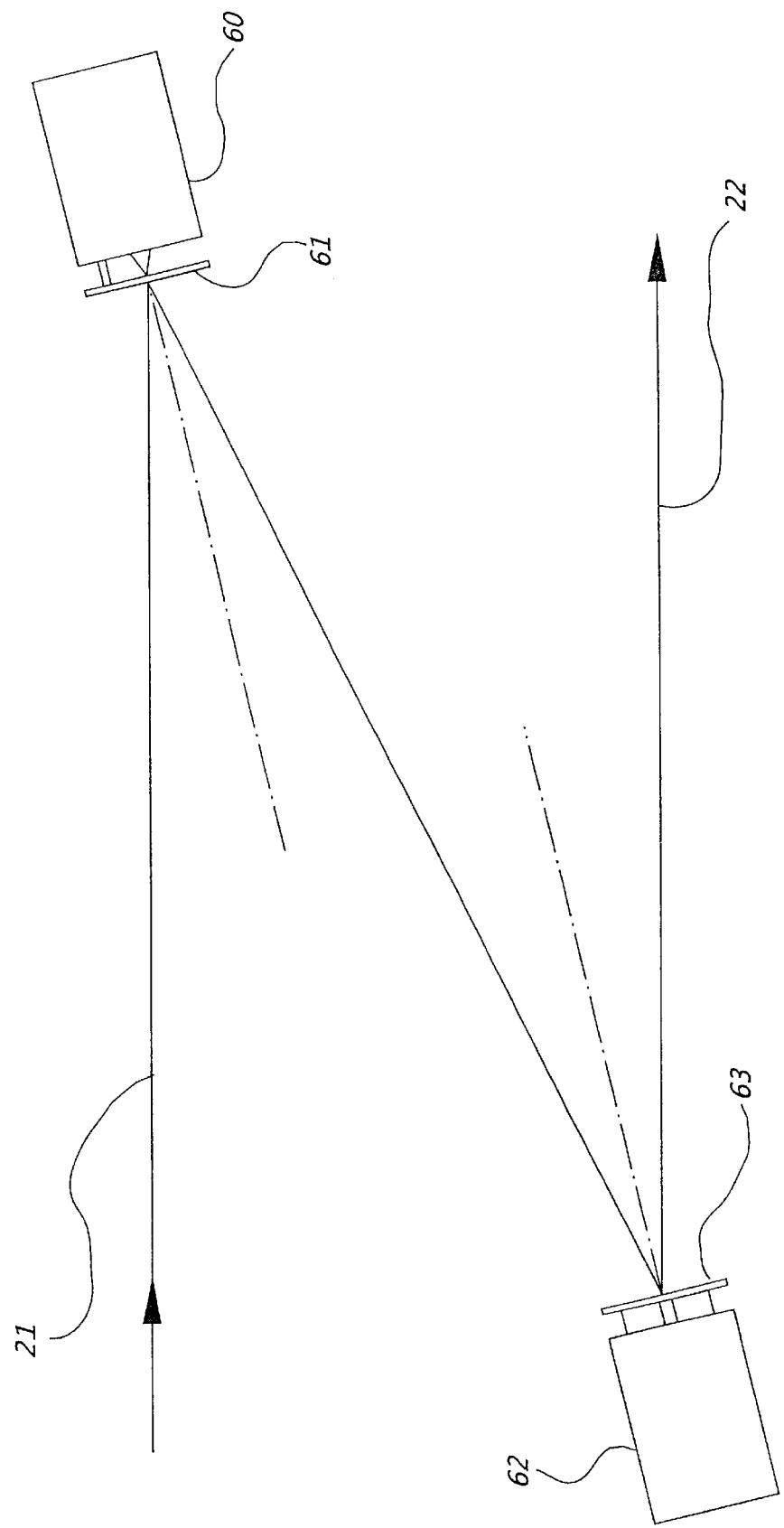
FIG. 7 is a schematic representation of a variable beam positioning unit in the apparatus of FIG. 1, which uses piezo-driven adjustable mirrors.
Figure 8:
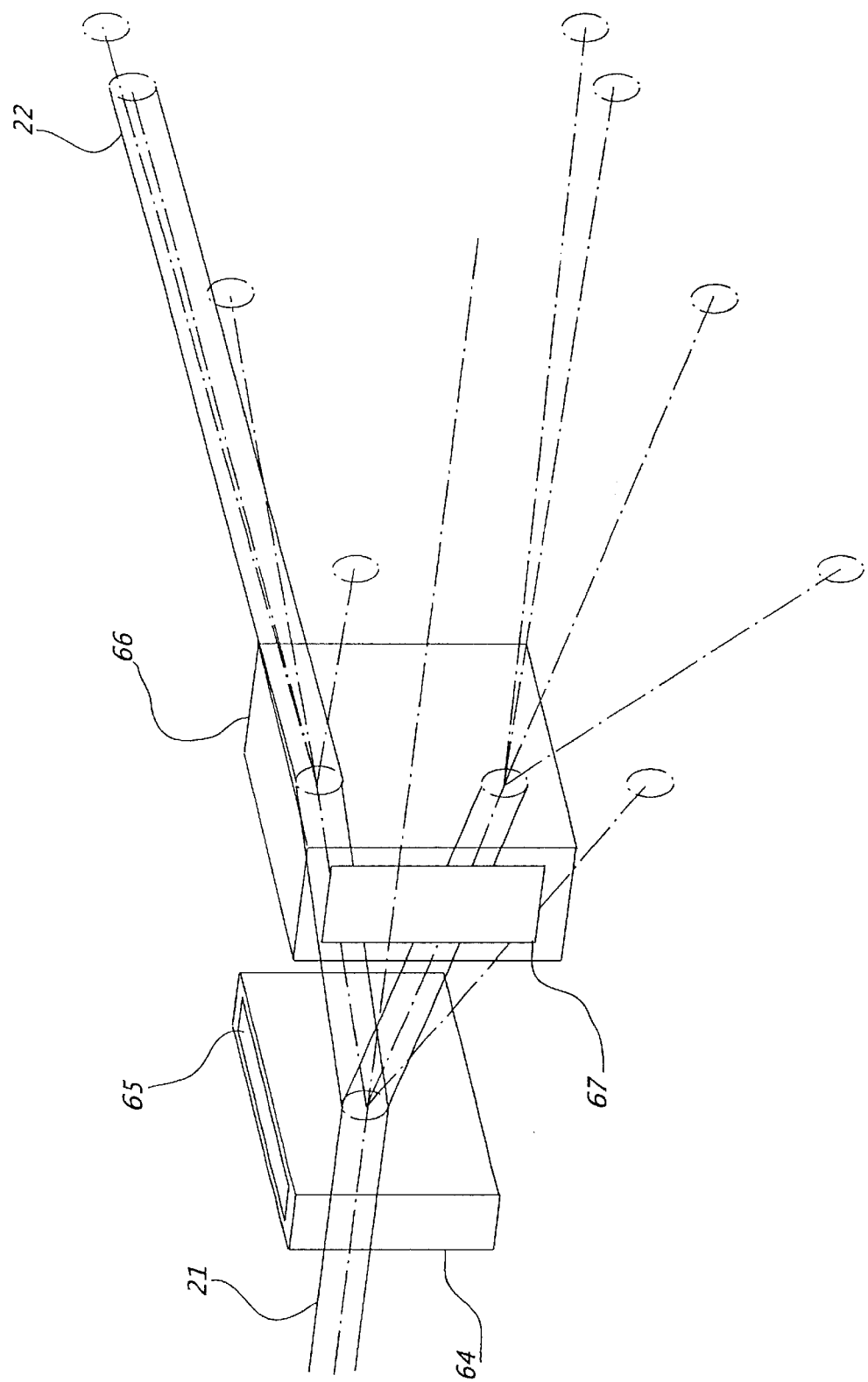
FIG. 8 is a schematic representation of a variable beam positioning unit in the apparatus of FIG. 1, which uses acousto-optical deflectors.
Figure 9:
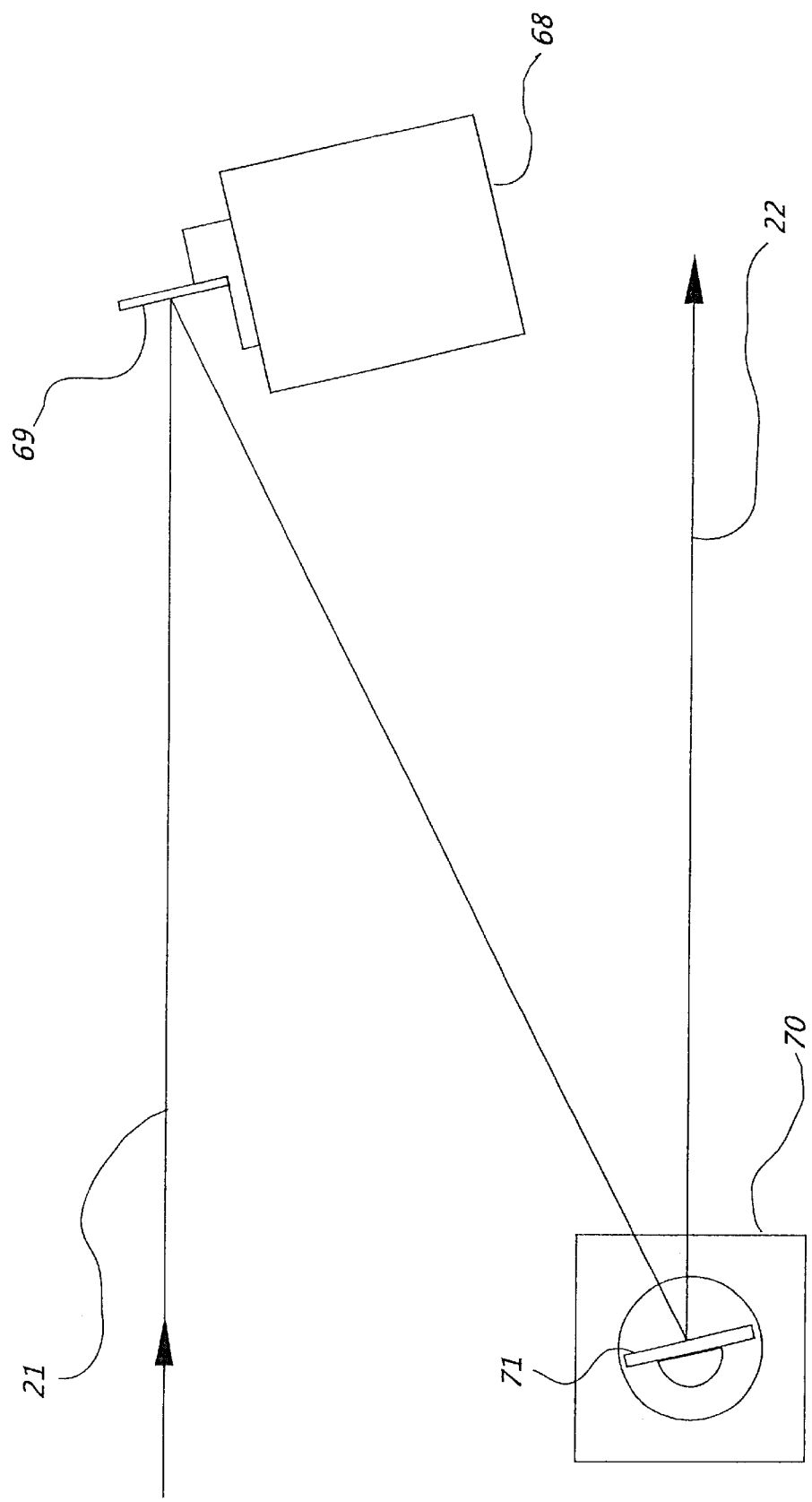
FIG. 9 is a schematic representation of a variable beam positioning unit in the apparatus of FIG. 1, which uses galvanometer-driven adjustable mirrors.

The light entering the beam deflection unit 3 is conducted through two deflection units, in accordance with the control signals from the control unit 14, as shown in FIGS. 7, 8, and 9. As a result, the exiting beam 22 enters the lens 4 at modifiable angles of incidence that can be separately controlled in the X and Y directions. The lens images the incident light, which strikes as a flat wave, in a beam spot—hereinafter referred to as a "spot"—on the substrate 5 to be treated. The XY position at which the spot strikes the substrate 5 within the write window 23 depends on the angle of incidence in the lens and the focal length of the lens, as shown in FIG. 2. At small angles of deflection ($\alpha < 8$ mrad, see detail 24 in FIG. 2), a deflection (see detail 25 in FIG. 2) and thus a write window according to equation [1]

$$\delta x = \alpha * F \quad [1]$$

of approximately 2–4 mm can be achieved. The diameter (see detail 27 in FIG. 2) of the spot on the substrate depends on the diameter (see detail 26, FIG. 2) of the incident light beam:

$$d = 1.21 * \lambda * F/D \quad [2]$$

where $\delta x$ = spot position relative to the write window $\alpha$ = angle of incidence F = focal length of the lens d = diameter of the spot $\lambda$ = wavelength of the light used D = diameter of the incident beam For small beam deflections a large spot is obtained on the substrate, and for large deflections the light is focused more tightly, and a smaller spot diameter and, thus, a smaller bore hole diameter on the substrate are obtained.

Figure 3:
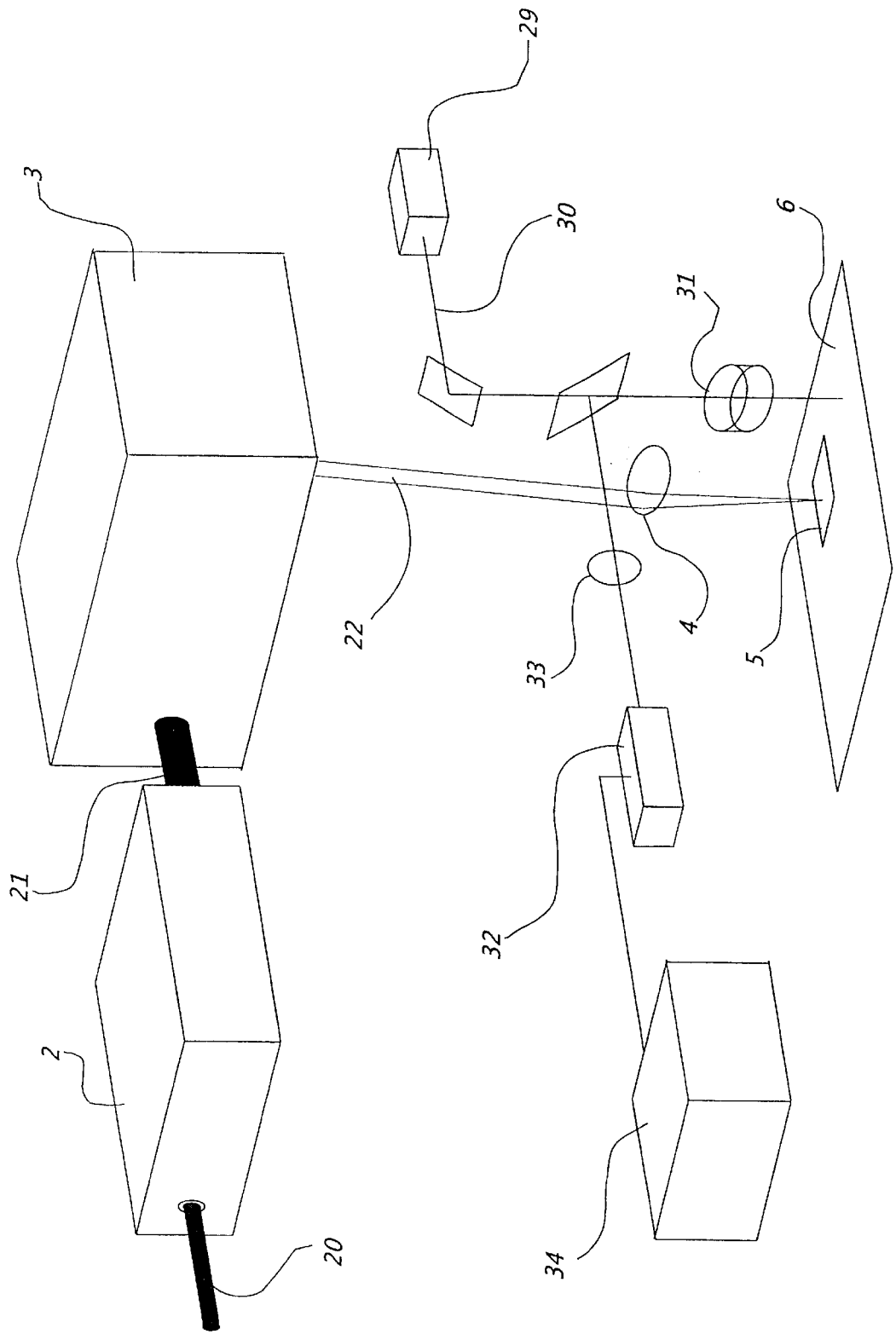
FIG. 3 is a schematic illustration of the image processing component of an apparatus for carrying out the invention.

The substrate 5 to be treated is secured to the XY stage by appropriate measures such as vacuum suction or a clamping device. Two interferometer mirrors, an X mirror 7 and a Y mirror 10, are situated on the XY stage at the same height as the substrate. By use of interferometer measuring heads, an X measuring head 9 and a Y measuring head 11, the position of the XY stage at the time is measured at high resolution and speed. The signals from the interferometer system are fed to the XY stage positioning electronic system 13 and to the beam divergence control 14. The positioning unit 13 controls the drive units of the XY stage to produce the line or course or movement specified by the computer 16. Finally, an image recording and treatment unit 15 is provided. The image recording unit shown in FIG. 3 corresponds to a reflected light microscope which comprises a light source 29, illumination beam path 30, and lens 31, as well as an electronic camera 32 and a field lens 33 arranged in front of the camera. The signals from the camera are supplied to the local image processing computer 34. The beam path of the image recording is disposed parallel to the treatment beam path, so that by moving the XY stage the entire substrate can be placed below the camera lens 31 and is thus made available to the image processing computer for measurement purposes.

Components 13 through 18 are connected to one another by a heterogeneous bus system 19. The image processing unit 15 and control unit 14 for beam divergence are connected to the central control computer 16 via a parallel data bus because of the larger data volumes to be exchanged.

The course of the treatment process according to the invention will now be described.

Substrate 5, which is affixed to the XY stage 6, is positioned below the write lens 4 in such a way that the bore hole coordinates lie within the write window 23. If the XY stage 6 has approached the coordinates $X_{stage}$, $Y_{stage}$ and the beam divergence unit 3 in conjunction with the lens 4 has a scan region of $\delta x$, $\delta y$ according to equation [2], all bore holes having coordinates in the range of $$X_{stage} - \delta x < X_{bore\ hole} < X_{stage} + \delta x \quad [3]$$

$$Y_{stage} - \delta y < Y_{bore\ hole} < Y_{stage} + \delta y$$

can be treated. The control signals for the beam divergence 3 are calculated by the computer 16 from the target bore hole coordinates and the stage coordinates. Both sets of coordinate values, hereinafter referred to as "ticks," are present in the base units of the interferometer. The size of these ticks depends on the working principle of the interferometer and the wavelength of the light used.

An HeNe laser, which emits light with a wavelength of approximately $\lambda_{HeNe} \approx 633$ nm, is typically used. This results in a tick size of approximately $\lambda_{HeNe}/16 \approx 40$ nm, for example. After the positioning process is completed, the location of the XY stage has the following coordinates:

$$X_{stage\ actual} = X_{stage,\ target} + \epsilon_x \qquad [4]$$

$$Y_{stage\ actual} = Y_{stage,\ target} + \epsilon_y$$

where $\epsilon_x$ and $\epsilon_y$ denote the static position errors of the XY stage system.

$$X_{defl.} = X_{bore\ hole} - X_{stage,\ target} - \epsilon_x \qquad [5]$$

$$Y_{defl.} = Y_{bore\ hole} - Y_{stage,\ target} - \epsilon_y$$

The calculated values $X_{defl.}$ and $Y_{defl.}$ thus compensate for the position errors of the XY stage system. The result $$X_{defl.} = X_{bore\ hole} - X_{stage,\ actual} \qquad [6]$$

$$Y_{defl.} = Y_{bore\ hole} - Y_{stage,\ actual}$$

is initially present as an integer value in tick units. To control the beam divergence, however, an analog voltage, for example in the range of 0–10 volts, is generally required, the voltage being obtained from a digital/analog converter unit which is charged by the computer. There is a fixed association or relationship of the input voltage of this component and the written value. The calculated values for the beam divergence, therefore, must be scaled. This scaling operation requires additional computing capacity when it is program-controlled in the computer.

If, in addition, there is a nonlinear relationship between the control voltage of the beam divergence unit and the divergence produced, the necessary computing operations can be performed only by a very fast, and thus expensive, computer. For this reason, the scaling operation preferably is carried out by a hardwired electronic component within the control system of the divergence unit 14, as shown in FIG. 10.

Figure 10:
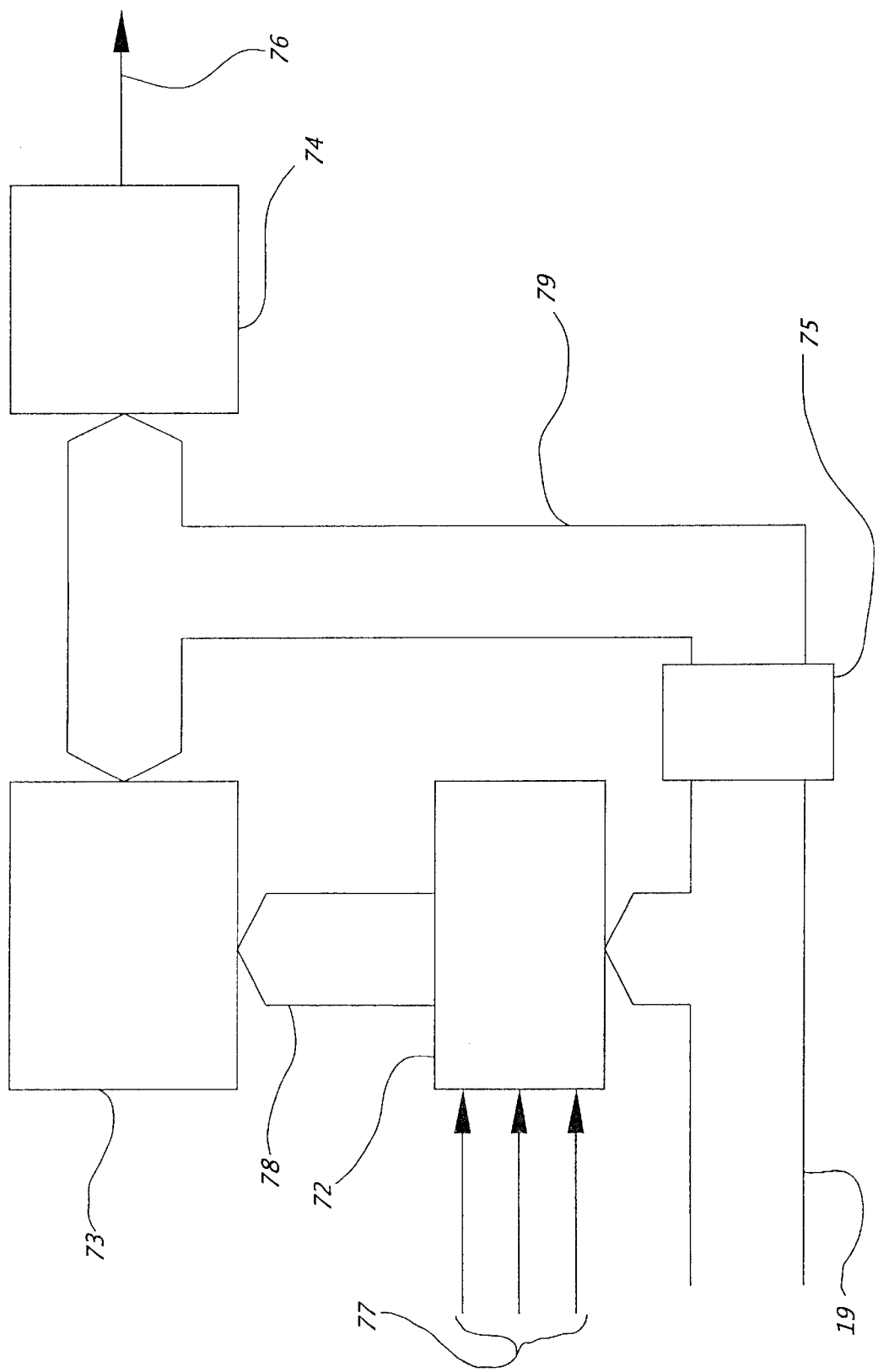
FIG. 10 is a schematic representation of the of the deflection unit control.

FIG. 10 shows the components for controlling a beam divergence channel, where X and Y are configured identically. In a one-time preparation step, a scaling table is loaded into memory 73. The computer writes the desired address to the forward/backward counter 72, which functions as an input register, and writes the corresponding data to the access control 75. In this phase the digital/analog converter 74 is deactivated. To carry out the scaling operations, the computer places the calculated $X_{defl.}$ and $Y_{defl.}$ values on the position counter, the outputs of which address memory 73. The value read from memory is transmitted to the digital/analog converter 74 and thus determines the control voltage for the beam deflection unit 3. For every possible input value, a scaled output value must be held in memory 73.

The range of deflection values from equation [6] is limited by the optically possible deflection range. If one starts with an address capacity of 20 bits in memory 73, $2^{20} \approx 1,000,000$ values may be stored. For a tick size of 40 nm, there results a maximum deflection range of approximately 40 mm. Since the address range may be easily expanded, operating ranges over 100 mm are possible, and for all practical purposes are limited only by the optically possible range.

For large-surface substrates a low throughput is obtained with the aforementioned method, since the XY stage system must carry out a positioning process for each treatment field.

To avoid this, the XY stage system is allowed to move continuously, in which case the dynamic error now must be compensated for. During continuous stage motion the laser spot must track the substrate motion in order to carry out multiple treatments at the same substrate site. If the XY stage system moves at velocities $v_x$ and $v_y$, the laser beam must be tracked, and deflected as a function of time, as follows:

$$X_{defl.}(t) = X_{bore\ hole} - X_{stage,\ actual\ at\ T0} = v_x^* t \qquad [7]$$

$$Y_{defl.}(t) = Y_{bore\ hole} - Y_{stage,\ actual\ at\ T0} = v_y^* t$$

The deflection values are composed of a static portion that depends only on the coordinates of the bore hole to be produced and on the stage coordinates, which may be chosen, in addition to a component that is determined by the XY stage velocity at the time. In this mode of operation the XY stage 6 together with the substrate 5 moves at a velocity, not necessarily constant, along the Y axis, for example. The computer 16 calculates the required deflection values and compares them to the maximum possible values. As soon as these values are sufficiently small, i.e., when the bore hole coordinates appear in the treatment window, the static portion is calculated from equation [7] as follows $$X_{start} = X_{bore\ hole} - X_{stage,\ actual\ at\ T0} \qquad [8]$$

$$Y_{start} = Y_{bore\ hole} - Y_{stage,\ actual\ at\ T0}$$

and is loaded into the counter 72. The dynamic error v*t is compensated for by counting the interferometer signals in the counter 72. At a XY stage velocity of 100 mm/second, for example, in the Y direction, and an interferometer resolution, or tick size, of approximately 40 nm, about $2.5*10^6$ count signals are delivered from the interferometer 11 to the Y counter 72 at an average time interval of approximately 400 ns. The output of this counter thus represents the continuously changing deflection value for the Y axis, and is scaled and used to control the beam deflection unit 3. Since identically configured deflection controls are present for both axes of motion according to FIG. 10, the vectorial direction of motion is not limited.

Because the counter 72, which is identical for the X and the Y directions, is designed as a forward/backward counter, both positive and negative dynamic errors can be compensated for. The type of motion of the XY stage system can therefore be freely chosen, and can be optimized for increased throughput.

In the foregoing description of the invention, it has been assumed that the bore hole coordinates represent fixed values. Since multilayer substrates in particular must pass through very different types of process steps during production, the dimensional stability of same is provided only to a limited extent. Because the positions of the bore holes at different locations are determined in relation to one another, specified position tolerances must not be exceeded. However, this would occur if the bore hole coordinates were held fixed, that is, independent of the substrate currently being treated.

If the material behavior were fully known and the process steps were not subject to variability, the bore hole coordinates could be corrected in advance. However, since process and material parameters are subject to variability, advance correction is practical only for appropriately small substrates. Because the residual errors are generally proportional to the substrate size in spite of advance correction, such a method is not acceptable for large substrates. Dynamic correction of the substrate distortions allows this limitation to be overcome.

The first step in this embodiment of the inventive method is measurement of the substrate. Markers or alignment marks whose target coordinates are known must be present on the substrate. These marks were created in the preceding treatment step, for example, and must be exposed, if needed, in order to be optically detectable by the camera system 15. Depending on the number of available marks, different errors or distortions may be detected and compensated for.

Measurement of the substrate initially involves determination of the absolute coordinates of the marks in relation to the XY stage coordinate system. To this end, the XY stage 6 positions the substrate 5 in such a way that the alignment marks appear in the image field of the camera system 15. The associated image processing computer determines the coordinates relative to the midpoint of the image field. The absolute coordinates are obtained by adding the screen coordinates, that is, the distance between scaled picture elements, and the XY stage coordinates are measured by the interferometer heads 9 and 11. By measuring one mark, the XY stage coordinate system used can be displaced so as to be congruent with an imaginary coordinate system on the substrate. However, due to substrate distortion, this congruence can be assured only for the one measured mark. By measuring another mark and comparing the target position of same, possible twisting of the substrate $$\phi = (Y_{actual, mark\ 1} - Y_{actual, mark\ 2}) / (X_{actual, mark\ 1} - X_{actual, mark\ 2}) \quad [9]$$

in the direction of motion of the XY stage, and a longitudinal distortion $$\xi x = (X_{actual, mark\ 1} - X_{actual, mark\ 2}) / (X_{target, mark\ 1} - X_{target, mark\ 2}) \quad [10]$$

in one axis are determined. In equations 9 and 10, it is assumed that both marks are situated at the same height, that is, having identical Y coordinates, and on the left and right edge of the substrate. In general this is not an absolute prerequisite, in which case this method is not changed; however, the misalignments in the X and Y directions that are known at that time must be inserted in the equations.

If additional alignment marks are available, measurement of these marks determines the longitudinal distortion in the Y direction, analogous to equation 10, or, by averaging, improves the accuracy of measurement. After the first step involving parameterization of the contact error and detection of the substrate distortion is concluded, these effects are compensated for during the treatment process.

Particularly for substrates that contain multiple printed panels, a distinction is made between global contact errors and local parameters that may be determined separately for each panel. The global contact errors are compensated for by translation and rotation of the XY stage coordinate system. To compensate for the local distortion effects and optionally for the rotation or translation of individual panels that appears relative to the overall substrate, the bore hole coordinates must be transformed separately for each panel:

$$X_{bore\ hole} = G_{xx} * X_{design} + G_{xy} * Y_{design} + G_{zz} \quad [11]$$

$$Y_{bore\ hole} = G_{yz} * X_{design} + G_{yy} * Y_{design} + G_{yz}$$

The numerical values of the transformation parameters $G_{ij}$ are calculated from the measured distortion parameters.

The essence of the method according to a preferred embodiment is that after all relevant distortion parameters have been detected, the bore hole coordinates that are present in ideal design coordinates are transformed into a real coordinate system during the treatment phase, and the variation of the parameters is taken into account for multiple purposes on a substrate, thereby minimizing the expense for memory space and the ensuing computing and comparison operations.

Figure 4:
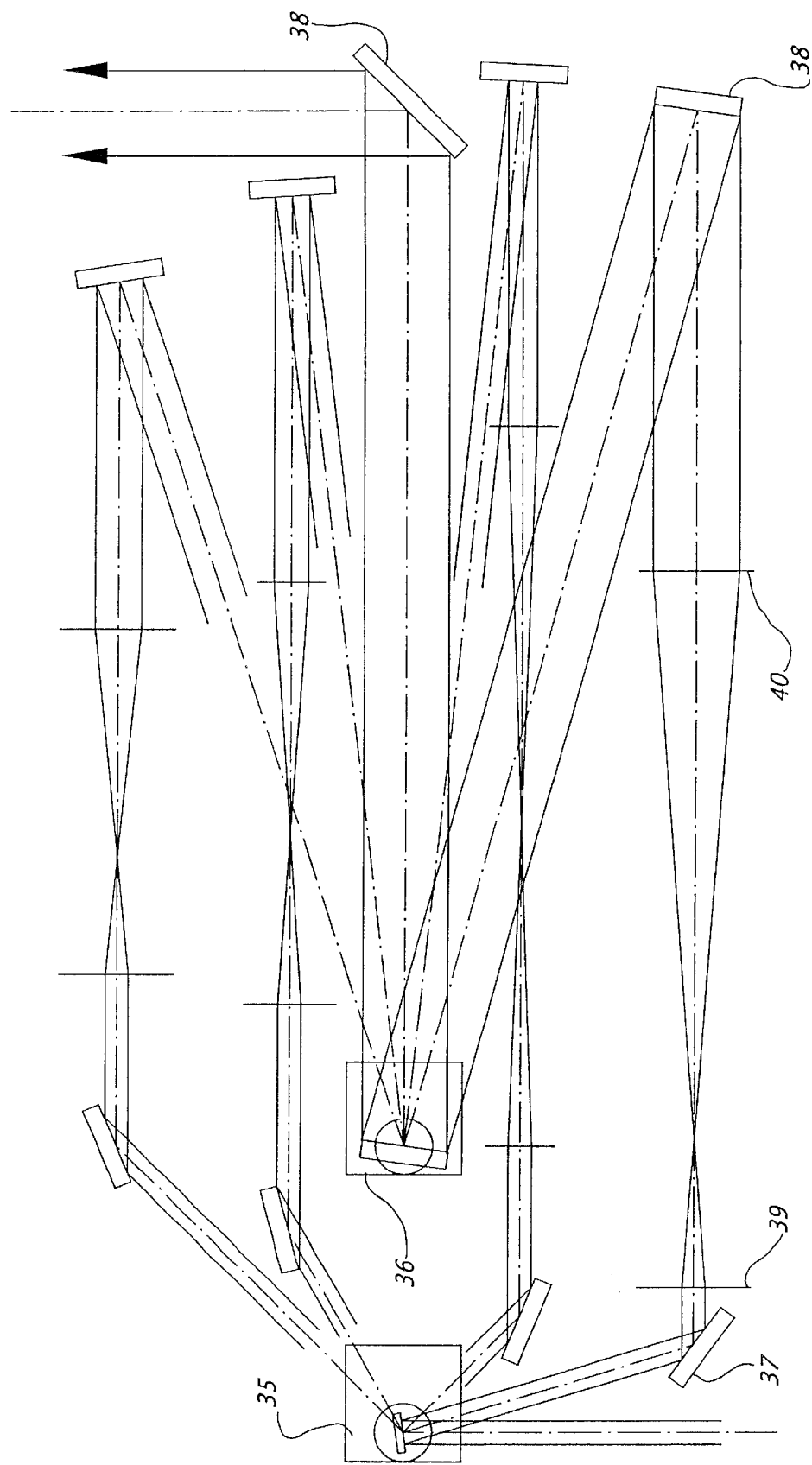
FIG. 4 is a schematic representation of the controllable beam expansion in the apparatus of FIG. 1, using galvanometer mirrors.

The throughput must be maximized to enable economic operation of a production unit according to this invention; that is, the treatment time per boring must be minimized. The material required to be removed to produce the boring depends on the energy density on the substrate surface. For a relatively weak laser, the laser beam must be tightly focused to achieve appreciable removal; that is, the diameter of the hole for a one-time operation of the laser must be small in relation to the hole diameter required by the design. The combination of treatment steps is very time-intensive, and may be avoided if the spot diameter can be adapted to the bore hole diameter. In another preferred embodiment of the invention, the size of the spot may be varied quickly by modifying the beam expansion. FIG. 4 shows a basic schematic of the arrangement for stepwise modification of the beam diameter. The arrangement comprises expansion lenses arranged in pairs, the distance between the lenses corresponding to the sum of their focal lengths, so that a parallel ray bundle undergoes a fixed expansion as follows:

$$F1/F2 = D1/D2 \quad [12]$$

where
- F1=focal length of the entry lens
- F2=focal length of the exit lens
- D1=beam diameter at entry
- D2=beam diameter at exit Switching the beam path provides a plurality of fixed expansions for selection. Switching is performed by the galvanometer mirrors 35 and 36. Auxiliary mirrors are necessary to enable parallel mounting of the pair of expansion lenses.

Figure 5:
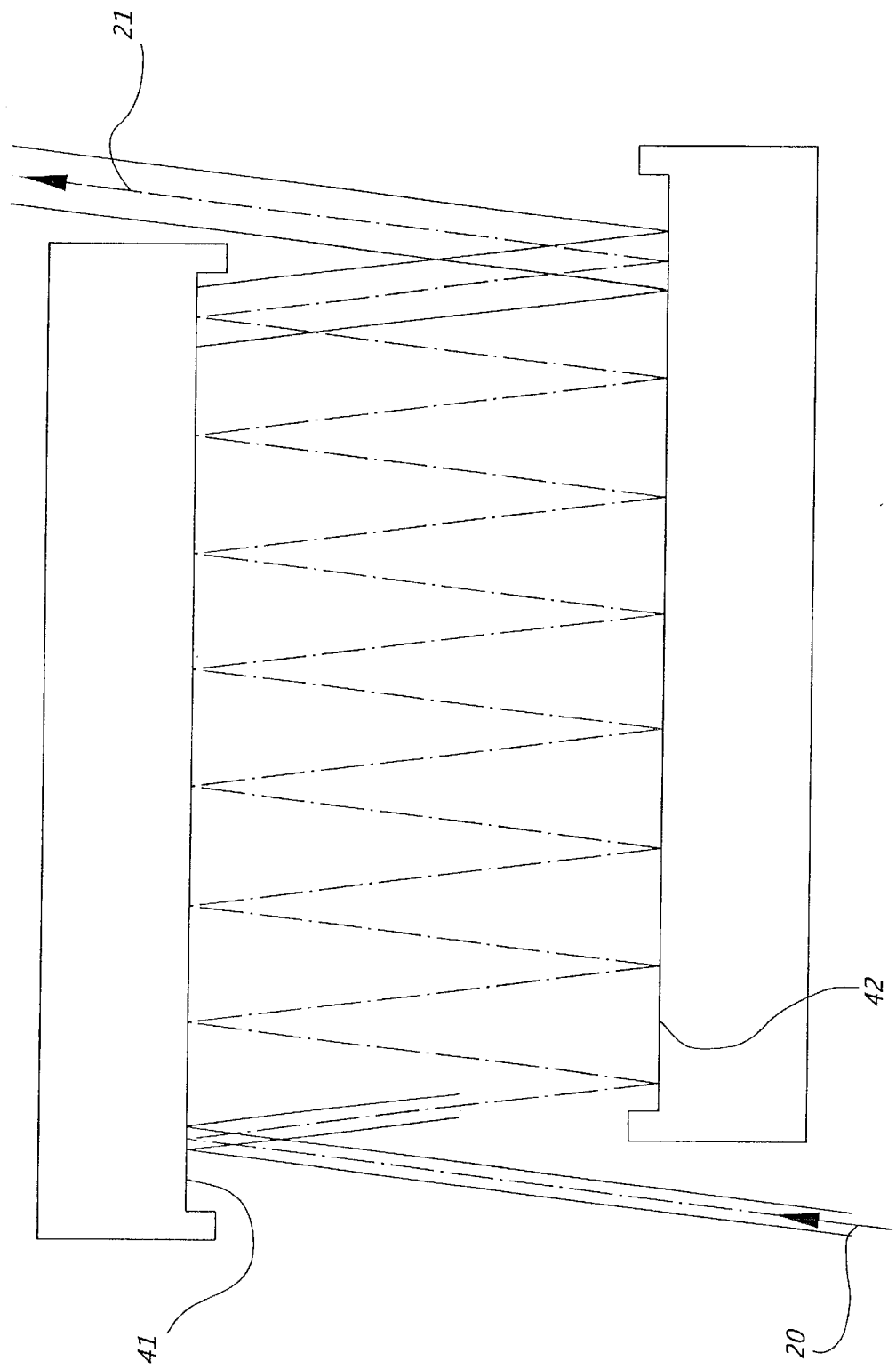
FIG. 5 is a schematic representation of an infinitely adjustable beam expansion unit which uses active mirror elements.

An additional optical system is used to allow infinitely variable expansion, as shown in FIG. 5. The system comprises two active mirror elements 41 and 42. The incident parallel beam diverges after reflection on the convex mirror 42. After reflection on the concave mirror 41, the beam is once again parallel under the following condition:

$$a = f3 + f4 \quad [13]$$

where
- a=distance from the mirror
- f3=focal length of the concave mirror
- f4=focal length of the convex mirror
- D3=beam diameter for mirroring
- D4=beam diameter after variable expansion For the ratio of the beam diameters in front of and behind this arrangement, the following equation, analogous to [12], applies:

$$f3/f4 = D3/D4 \quad [14]$$

By appropriate choice of the angle of incidence, the laser beam may be caused to undergo multiple reflections on the mirror pair. Since the beam diameter is expanded upon each pass according to equation [14], the total effect on the laser beam increases exponentially. The resulting overall expansion is as follows:

$$D_{out} = D_{in} * (f3/f4)^N \quad [15]$$

where $D_{out}$=beam diameter after variable expansion
$D_{in}$=beam diameter before variable expansion
N=number of multiple reflections When N=8, for example, is reached, an expansion of approximately 10%, that is, D3/D4=f3/f4 ≈ 1.1, is sufficient to achieve a twofold overall expansion. An infinitely variable choice of beam diameter, and thus the size of the spot on the substrate, is made possible in conjunction with the beam expansion graduated to a power of 2, as shown in FIG. 4. Switching, i.e., changing the beam diameter, is performed on the one hand by changing the control signal for the galvanometer rotating mirror in the arrangement shown in FIG. 4, so that the laser beam is conducted through another lens pair. On the other hand, in a parallel procedure the control voltage of the active mirror pair is modified as shown in FIG. 5.

Figure 6:
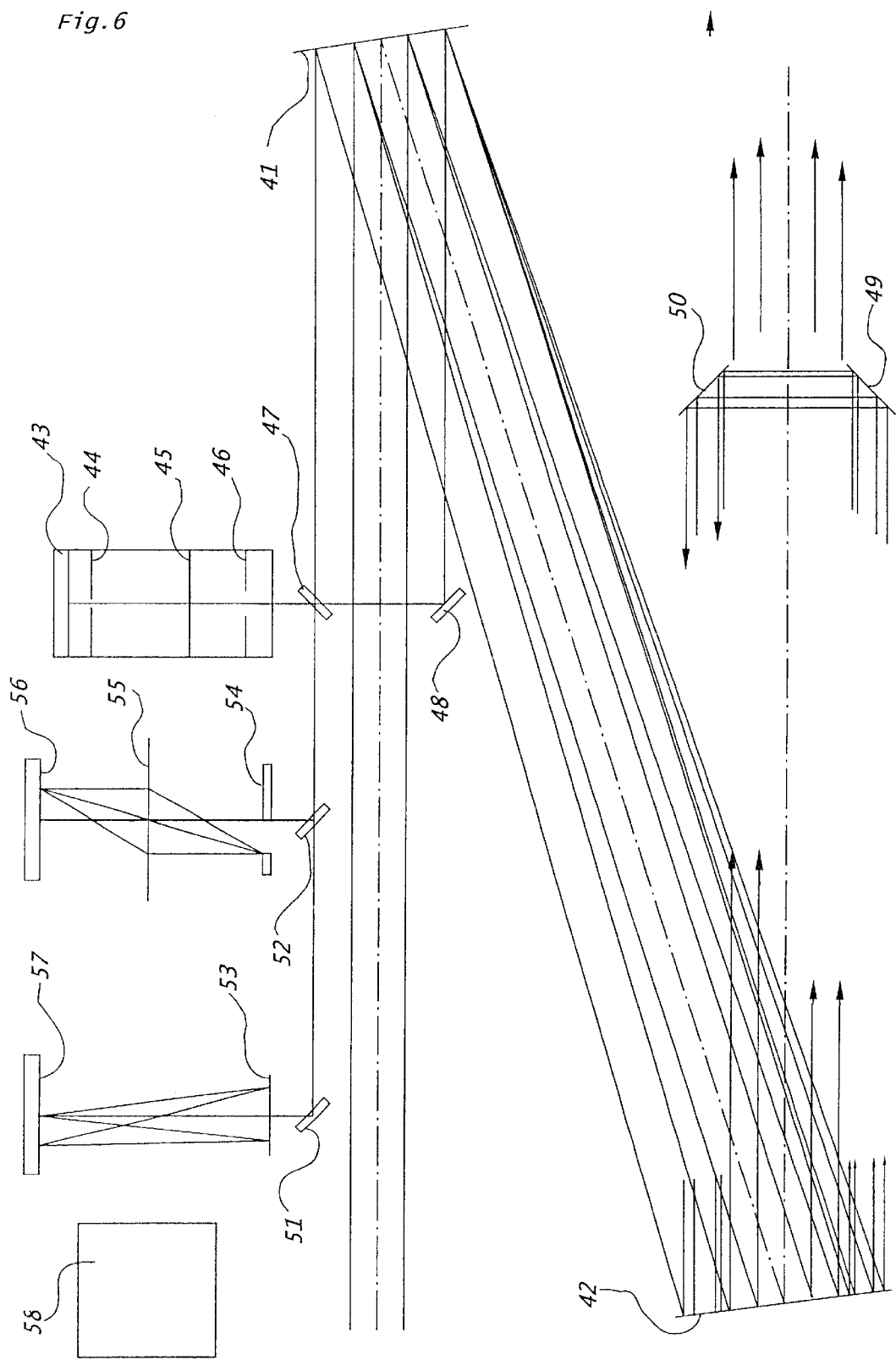
FIG. 6 is a schematic representation of the beam path for measuring and regulating the beam expansion using an active mirror.

The focal length of an active mirror is a function of the applied voltage, as well as a number of material factors and the chosen operating conditions. To obtain a stable and, in particular, reproducible operating procedure, a control loop may be used to check the control voltages of the active mirrors. FIG. 6 shows the beam path used to measure the beam expansion through the active mirrors. Starting with a light source such as a semiconductor laser 43, a parallel ray bundle is produced using a pinhole aperture 44, a collimator lens 45, and a circular aperture 46. This ray bundle is split by a beam splitter 47 into a reference beam and a measurement beam. The measurement beam is conducted through the mirror 47 parallel to the exit beam, and then through the active mirrors 41 and 42. The measurement beam passes through the mirror arrangement twice, since after exiting, the beam is sent back through two auxiliary mirrors 49 and 50. If the active mirrors are controlled correctly, the measurement beam exits the mirrors parallel to the axis of incidence and is shifted by a defined distance. Both of these parameters are recorded by imaging the measurement and reference beams on two sensors. The two beams are split by a beam splitter 52. Both beams are imaged once via the auxiliary mirror 51 and the collimator lens 53 onto a line sensor 57 as points.

If the measurement beam is no longer parallel to the reference beam, the two picture elements are not congruent with the line sensor. The beams that have been uncoupled by the beam splitter 52 illuminate a semicircular screen 54. This screen is imaged on another line sensor 56 by a lens 55. The parallel shift of the measurement and reference beams may be determined from the profile of the output signal of this sensor. The measurement signals are preprocessed and act as actual value signals for the computer 58, thus allowing the signals corresponding to the required target values to be calculated for the electronic control system.

The beam divergence will now be described. The described invention requires rapid and precise beam divergence. The methods described below are suitable for this purpose.

To perform the beam divergence required in this invention, the expanded laser beam is guided via two galvanometer mirrors arranged perpendicular to one another, as shown in FIG. 9. The actual value signals that reproduce the mirror position are used in the deflection control 14 in such a way that the mirrors 69 and 71, with the assistance of the galvanometer drives 68 and 70, are configured so that the static position error is compensated for and/or the mirror is tracked so that the dynamic position errors disappear. Galvanometer mirrors allow a large deflection region, but because of their structural shape they require a large distance from the write lens 4.

If a smaller angle of deflection can be used, piezomirrors are suitable for ray deflection, as shown in FIG. 7. The piezodrives 60 and 62 tilt the respective scan mirrors 61 and 63 to obtain the required beam deflection. An ideal telecentric ray path may be achieved by use of two-axis piezomirrors.

Although piezomirrors perform positioning significantly faster, there is still a marked delay between the output of the required target position via the computer and reaching the corresponding actual position via the mirror. A distinctly lower positioning time results when the beam deflection is produced by acousto-optical deflectors, as shown in FIG. 8. For deflection, a diffraction grid is produced in crystals 64 and 66 by an acoustic wave. The angle of deflection is proportional to the spatial density of the diffraction grid, thereby allowing an infinitely variable adjustment to be made by changing the frequency of the control signal (approximately 100–200 MHz) supplied by transducers 65 and 67, respectively. Since in this method only the filling time for the crystal, which is approximately 30 $\mu s$ for a crystal size of about 20 mm, and a typical acoustic velocity of approximately 600 meters/second represent a time limitation, this device is optimally suited for rapid and precise beam deflection.

The foregoing description and examples have been set forth merely to illustrate the invention and are not intended to be limiting. Since modifications of the described embodiments incorporating the spirit and substance of the invention my occur to persons skilled in the art, the invention should be construed broadly to include all variations falling within the scope of the appended claims and equivalents thereof.

What is claimed is:

1. An apparatus for producing microbore holes in a multilayer substrate comprising writing optics for generating a light spot from a light beam source;

an XY stage for moving the substrate to different treatment positions below the writing optics;

said writing optics including a beam deflecting unit comprising electronically controlled, movable mirrors for changing the position of the light spot within a working field on the substrate simultaneously with the treatment positions;

means for determining the position of the substrate, and a computer for processing signals corresponding to the substrate position to obtain an actual position of the XY stage, wherein said writing optics further comprise a variable beam expansion optics arranged in a light beam path between the light source the beam deflection unit; said variable bean expansion optics outputing a light beam having a diameter that is varied according to an expansion ratio determined by the computer.

2. An apparatus according to claim 1, wherein the light source is a laser, and said computer is provided with all bore hole coordinates and bore hole diameters in a tabular form.

3. An apparatus according to claim 1, wherein the means for determining the substrate position comprises an interferometer with X and Y mirrors arranged in X and Y directions on the XY stage.

4. An apparatus according to claim 1, wherein the substrate is positioned with individual writing fields below the writing optics in order to treat the respective individual writing fields, and said apparatus further comprising a ray deflection unit for tracking the light spot to facilitate compensation of static position errors in X and Y axes of motion.

5. An apparatus according to claim 4, wherein during the treatment of individual fields below the writing optics, the bore hole coordinates are corrected by an amount corresponding to a measured substrate distortion.

6. An apparatus according to claim 1, wherein the XY stage continuously moves the substrate during treatment, and said apparatus further comprising a ray deflection unit for tracking the light spot in order to compensate for dynamic position errors of the substrate in X and Y axes of motion.

7. An apparatus according to claim 6, wherein during the treatment of the continuously moved substrate below the writing optics, the bore hole coordinates are corrected by an amount corresponding to a measured substrate distortion.

8. An apparatus according to claim 1, wherein the computer performs all coordinate calculations in counting units of the system for determining the substrate position, and scaling operations required for controlling the light positioning unit in the writing optics are carried out using allocated memory tables.

9. An apparatus according to claim 8, wherein the computer calculates the position of the substrate based on signals received from an interferometer.

10. An apparatus according to claim 1, wherein the writing optics change the diameter of the light spot on the substrate in such a way that different bore hole diameters are produced in one operation with a single layer pass; whereby material is removed from each bore hole without multiple laser passes along a preset course.

11. An apparatus according to claim 1, wherein the writing optics change the diameter of the light spot on the substrate in such a way that bore holes having different diameters are introduced in the substrate, with the light spot diameter in each case being specified in accordance with the respective bore hole diameter.

12. An apparatus according to claim 1, wherein the writing optics comprise active mirror elements for varying the beam diameter.

13. An apparatus according to claim 12, wherein said active mirror elements have a focal length that is changed by applying a voltage.

14. An apparatus according to claim 12, wherein the active mirror elements are continuously optically measured using an auxiliary beam, and the active mirror elements are adjusted in response to the optical measurements.

15. An apparatus according to claim 1, wherein the writing optics comprise galvanometrically controlled rotating mirrors for varying the position of the light spot.

16. An apparatus according to claim 1, wherein the writing optics comprise piezo-driven adjustable mirrors for varying the position of the light spot.

17. An apparatus according to claim 1, wherein the writing optics comprise acousto-optical beam deflectors for varying the position of the light spot.

* * * * *